United States Patent
Ko

(10) Patent No.: US 7,408,419 B2
(45) Date of Patent: Aug. 5, 2008

(54) SIGMA-DELTA FRACTIONAL-N PLL WITH REDUCED FREQUENCY ERROR

(75) Inventor: Sang-Soo Ko, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 108 days.

(21) Appl. No.: 11/586,381

(22) Filed: Oct. 25, 2006

(65) Prior Publication Data
US 2007/0164829 A1 Jul. 19, 2007

(30) Foreign Application Priority Data
Jan. 17, 2006 (KR) ............ 10-2006-0004958

(51) Int. Cl.
*H03L 7/095* (2006.01)
*H03L 7/107* (2006.01)
*H03L 7/18* (2006.01)

(52) U.S. Cl. ............... 331/17; 331/16; 331/25; 331/DIG. 2

(58) Field of Classification Search ........ 331/1 A, 331/8, 16–18, 25, DIG. 2; 327/156–159; 329/325; 332/127; 360/51; 375/376; 455/260
See application file for complete search history.

(56) References Cited

U.S. PATENT DOCUMENTS

| 3,909,735 | A | * | 9/1975 | Anderson et al. | ........... 331/10 |
| 4,745,372 | A | | 5/1988 | Miwa | ............ 331/8 |
| 4,928,075 | A | * | 5/1990 | Leis | ........... 331/17 |
| 6,111,470 | A | | 8/2000 | Dufour | ........... 331/17 |

OTHER PUBLICATIONS

Korean Patent Application No. 1020010038578 to Lee et al., having Publication date of Sep. 3, 2001 (w/ English Abstract page).
Korean Patent Application No. 1020030047421 to Kim, having Publication date of Jan. 21, 2005 (w/ English Abstract page).
Japanese Patent Application No. 01-275426 to Daisuke et al., having Publication date of Jun. 11, 1991 (w/ English Abstract page).
Japanese Patent Application No. 2003-020459 to Yoshiyuki et al., having Publication date of Aug. 19, 2004 (w/ English Abstract page).

* cited by examiner

*Primary Examiner*—David Mis
(74) *Attorney, Agent, or Firm*—Monica H. Choi

(57) ABSTRACT

A sigma-delta fractional-N phase locked loop has faster lock time with increased charge pump current and decreased loop filter resistance in the unlock state. On the other hand, the sigma-delta fractional-N phase locked loop has lower noise susceptibility and lower frequency error with gradual decrease in charge pump current and gradual increase in loop filter resistance, in the lock state.

20 Claims, 13 Drawing Sheets

SIGMA-DELTA FRACTIONAL-N PLL WITH REDUCED FREQUENCY ERROR

BACKGROUND OF THE INVENTION

This application claims priority under 35 U.S.C. § 119 to Korean Patent Application No. 2006-04958, filed on Jan. 17, 2006 in the Korean Intellectual Property Office, the disclosure of which is incorporated herein in its entirety by reference.

1. Field of the Invention

The present invention relates generally to sigma-delta fractional-N phase locked loops, and more particularly, to reducing lock time and frequency error in a sigma-delta fractional-N phase locked loop by gradual change of resistance within a loop filter.

2. Background of the Invention

A phase locked loop is used to maintain a stable frequency or to precisely change a frequency of a signal from a signal generator. Generally, the phase locked loop comprises a phase comparator, a charge pump, a loop filter, a voltage controlled oscillator, and a frequency divider.

The phase comparator generates control signals by comparing a reference signal and a feedback signal to determine phase difference. The charge pump generates a current (or charge) in response to such control signals and supplies the generated current to the loop filter. The loop filter filters such a current from the charge pump to generate a filtered voltage to the voltage controlled oscillator.

The voltage controlled oscillator generates an output signal having a frequency proportional to the filtered voltage from the loop filter. The frequency divider performs frequency division on the output signal of the voltage controlled oscillator by a predetermined factor to generate the feedback signal.

Recently, a phase locked loop that reaches the lock state quickly is especially desired from rapid development of wireless communications. Since lock time is inversely proportional to loop bandwidth of the phase locked loop, the loop bandwidth of the phase locked loop is increased for reducing lock time. However, the phase locked loop is more susceptible to noise at higher loop bandwidth.

For reducing the effect of such noise, when the phase locked loop is in the unlock state, the lock time is reduced by increasing the current of the charge pump circuit and reducing the resistance of the loop filter to increase the loop bandwidth. On the other hand, in the lock state, the lock time is increased by increasing the resistance of the loop filter and reducing the current of the charge pump circuit to reduce the loop bandwidth. However, reducing such loop bandwidth diminishes the susceptibility of the loop filter to noise.

FIG. 1 shows a charge pump 200 and a loop filter 300 of the above-described phase locked loop for reducing lock time in the unlock state and for improving noise immunity in the lock state. A controller 700 supplies a current control signal CCS and a phase margin control signal CRS to the charge pump 200 and the loop filter 300, respectively.

The loop filter 300 is connected between a ground node and a first node N1 that is an output terminal of the charge pump 200. The charge pump 200 generates a charge pump current with a controlled level thereby determining loop gain, in response to an up-control signal up and a down-control signal dn, from a phase comparator.

The loop filter 300 has a resistance therein that is adjusted in response to the phase margin control signal CRS. When the phase locked loop is in the unlock state, a third switch SW3 and a sixth switch SW6 are closed in response to the control signals CCS and CRS. When the up-control signal up is also activated (with the down-control signal dn being deactivated) to close switches SW1 and SW4, the closed switch SW3 increases the charging current of the charge pump 200 to be from the current sources CS1 and CS3.

Alternatively, when the down-control signal dn is also activated (with the up-control signal up being deactivated) to close switches SW2 and SW5, the closed switch SW3 increases the discharging current of the charge pump 200 to be from the current sources CS2 and CS4. In either case of increased charging current and increased discharging current, the loop bandwidth of the phase locked loop is increased in the unlock state.

When the sixth switch SW6 is closed, a resistor R1 is connected in parallel with another resistor R2 between a third node N3 and the ground node. Thus, the effective resistance of the loop filter 300 is reduced, and the bandwidth of the phase locked loop is increased in the unlock state. Such increased loop bandwidth of the phase locked loop reduces lock time of the phase locked loop.

When the phase locked loop reaches the lock state, the switches SW3 and SW6 are opened. Thus, the current level of the charge pump 200 is reduced, and the resistance of the loop filter 300 is increased. As a result, the loop bandwidth of the phase locked loop is reduced for in turn reducing noise susceptibility.

As compared to the phase locked loop, a fractional-N phase locked loop generates a signal with a frequency resolution less than a reference frequency. However, the fractional-N phase locked loop defectively includes an in-band spur as a noise component in the loop bandwidth. Therefore, a sigma-delta fractional-N phase locked loop is used with a shift of such a spur to a higher frequency.

FIG. 2A illustrates the change in bandwidth of the sigma-delta fractional-N phase locked loop by operation of the charge pump 200 and the loop filter 300 of FIG. 1. Referring to FIG. 2A, the loop bandwidth of the phase locked loop is increased for faster lock in the unlock state. Alternatively, the loop bandwidth is reduced for reduced susceptibility to noise in the lock state.

FIG. 2B illustrates in-band noise in the loop bandwidth of sigma-delta modulation noise (hereinafter referred to as "SDM noise") when the loop bandwidth of the sigma-delta fractional-N phase locked loop is increased for faster lock in the unlock state. Referring to FIG. 2B, even after the noise spur generated by fractional-N division is sigma-delta modulated, the in-band noise is still widely present in the loop bandwidth (as illustrated by the shaded area in FIG. 2B).

FIG. 2C illustrates in-band noise of SDM noise when the loop bandwidth of the sigma-delta fractional-N phase locked loop is reduced in the lock state. Referring to FIGS. 2B and 2C, the in-band noise is reduced when the loop bandwidth is reduced (as illustrated by the shaded area in FIG. 2C).

FIG. 3A shows a simulation for frequency error of an output signal of the phase locked loop when the loop bandwidth of the sigma-delta fractional-N phase locked loop is increased to a wide bandwidth (20kHz) for faster lock in the unlock state and then reduced to a narrow bandwidth (2kHz) in the lock state. FIG. 3B shows an enlarged view of a dotted portion of the frequency error shown in FIG. 3A. Referring to FIG. 3B, the frequency error is larger for the wide bandwidth. The frequency error is reduced in the narrow bandwidth but lasts for a relatively long time after the lock state.

FIG. 4A illustrates a method for switching the loop bandwidth of the conventional sigma-delta fractional-N phase locked loop from a wide bandwidth to a narrow bandwidth. Referring to FIG. 4A, the loop bandwidth is reduced from 20

Khz to 2 Khz at once at time t1 by reducing the charge pump current from 32 mA to 2 mA and by increasing the resistance of the loop filter.

FIG. 4B shows the frequency error of the output signal of the phase locked loop when the loop bandwidth of the conventional sigma-delta fractional-N phase locked loop is switched from a wide bandwidth to a narrow bandwidth as illustrated in FIG. 4A. Referring to FIG. 4B, the frequency error lasts after the loop bandwidth is reduced, and the maximum frequency error after the reduction of the bandwidth occurs at time 851.7 usec with a frequency error of −4.947 Khz.

As the difference between the switched bandwidths becomes greater, the time needed for the frequency error to reach below a desired error range is extended. Thus, a sigma-delta fractional-N phase locked loop with reduction of such frequency error is desired.

SUMMARY OF THE INVENTION

Accordingly, a sigma-delta fractional-N phase locked loop according to aspects of the present invention includes more gradual change of the bandwidths from an unlock state to a lock state for reducing the frequency error of the phase locked loop.

A sigma-delta fractional-N phase locked loop according to an embodiment of the present invention includes a controller for generating at least one control signal indicating a lock state or an unlock state of the phase locked loop. In addition, such a phase locked loop also includes a loop filter that successively increases a resistance therein through at least one intermediate resistance from a low resistance to a high resistance when the at least one control signal indicates the lock state.

In one example embodiment of the present invention, the loop filter increases the resistance continuously in the lock state. Alternatively, the loop filter increases the resistance incrementally in the lock state.

In a further embodiment of the present invention, the sigma-delta fractional-N phase locked loop includes a charge pump that successively decreases a current therein through at least one intermediate current from a high current to a low current in the lock state. The charge pump generates an original signal filtered by the loop filter for generating a filtered signal. In one example embodiment of the present invention, the charge pump decreases the current continuously in the lock state. Alternatively, the charge pump decreases the current incrementally in the lock state.

In yet another embodiment of the present invention, the sigma-delta fractional-N phase locked loop includes a voltage controlled oscillator that generates an oscillation signal from the filtered signal.

In a further embodiment of the present invention, the sigma-delta fractional-N phase locked loop includes a frequency divider for performing frequency division on the oscillation signal to generate a divided oscillation signal. In addition, a phase detector of such a phase locked loop generates up and down control signals from comparing at least one of phases and frequencies of the divided oscillation signal with a reference signal.

In another embodiment of the present invention, the sigma-delta fractional-N phase locked loop also includes a channel selector that generates a modulation signal and a first frequency division factor from a channel selection signal. Such a phase locked loop further includes a sigma-delta modulator that generates a second frequency division factor from the modulation signal. In that case, the frequency divider performs frequency division on the oscillation signal according to the first and second frequency division factors to generate the divided oscillation signal.

In a further embodiment of the present invention, the sigma-delta fractional-N phase locked loop also includes a lock state detector for determining one of the lock state or the unlock state for the controller from the oscillation signal and the reference signal.

In an example embodiment of the present invention, the loop filter includes a first capacitor, a second capacitor, and a variable resistor. The first capacitor is coupled between an output of the charge pump and a ground node, and the second capacitor coupled to the output of the charge pump. The variable resistor is coupled between the second capacitor and the ground node, and the variable resistor generates the resistance that successively increases in the lock state.

In this manner, because the resistance of the loop filter is increased gradually, the frequency error of the sigma-delta fractional-N phase locked loop is decreased even when the current in the charge pump is decreased, in the lock state. Furthermore, when the current in the charge pump is also decreased gradually in the lock state, such a frequency error may be decreased even further.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2A, 2B, 2C, 3A, 3B, 4A, 4B, 5, 6, 7, 8, 9, 10, 11, 12A, 12B, 12C, 13, and 14 refer to elements having similar structure and/or function.

DETAILED DESCRIPTION OF THE INVENTION

Figure 5:
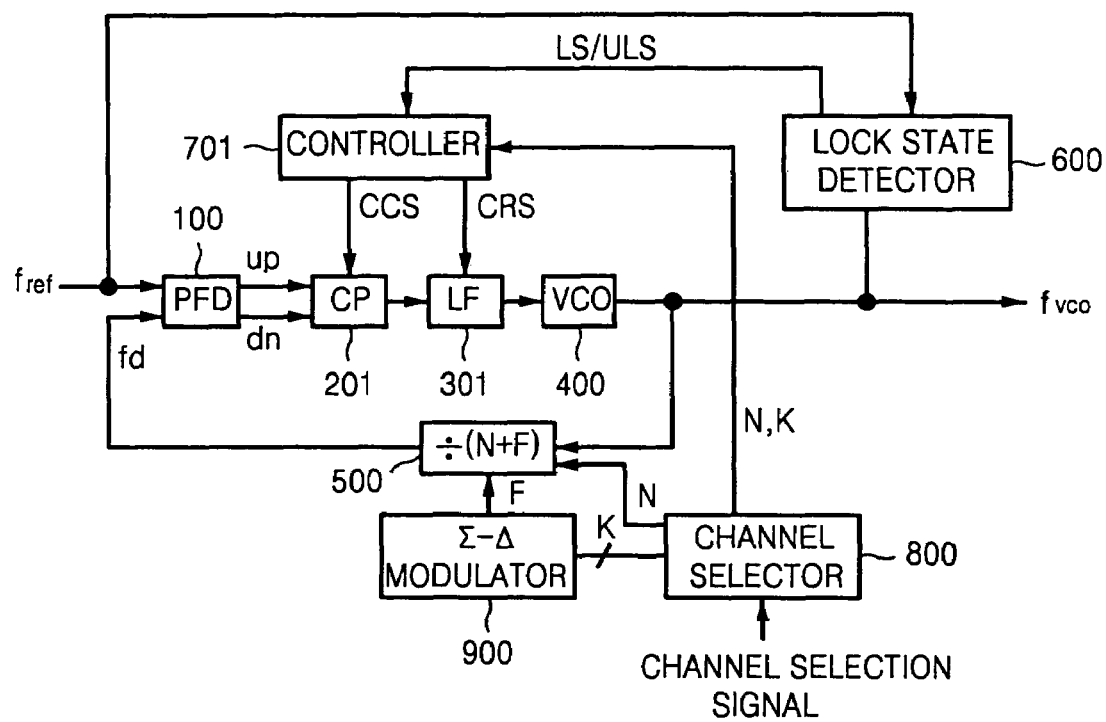
FIG. 5 shows a block diagram of a sigma-delta fractional-N phase locked loop, according to an embodiment of the present invention.

FIG. 5 is a block diagram of a sigma-delta fractional-N phase locked loop according to an embodiment of the present invention. The sigma-delta fractional-N phase locked loop of FIG. 5 minimizes frequency error generated upon switching from a wide bandwidth in an unlock state to a narrow bandwidth in a lock state.

Such a phase locked loop includes a phase comparator (or phase detector) 100, a charge pump 201, a loop filter 301, a voltage controlled oscillator 400, a frequency divider 500, a lock state detector 600, a sigma-delta modulator 900, a channel selector 800, and a controller 701. The phase comparator 100 may be substituted with a frequency and phase comparator.

The phase comparator 100 determines a phase difference between a reference signal fref and a feedback signal fd to generate control signals (up-control signal up and down-control signal dn). The charge pump 201 increases a charge pump current in response to the up and dn control signals and a current control signal CCS to increase a loop bandwidth for faster lock in the unlock state. Alternatively, the charge pump 201 reduces (either continuously or in incremental steps) the charge pump current in response to the up and dn control signals and the current control signal CCS to reduce the loop bandwidth in the lock state.

The loop filter 301 reduces a resistance therein in response to a phase margin control signal CRS to increase the loop bandwidth in the unlock state. Alternatively, the loop filter 301 increases (either continuously or in incremental steps) the resistance therein in response to the phase margin control signal CRS to decrease the loop bandwidth in the lock state.

The voltage controlled oscillator 400 generates an oscillation signal fvco having a frequency proportional to a filtered signal from the loop filter 301. The loop filter 301 filters an original signal from the charge pump 201 to generate the filtered signal.

The frequency divider 500 performs frequency division on the oscillation signal fvco by a dividing factor (N+F) to generate a divided oscillation signal that is the feedback signal fd. Here, N is a natural number and F is a fraction between 0 and 1, in one example embodiment of the present invention.

The lock state detector 600 outputs a state signal indicating one of a lock state LS or an unlock state ULS from the reference signal fref and the oscillation signal fvco. The state signal from the lock state detector 600 indicates whether the phase locked loop of FIG. 5 is in the lock state or the unlock state. The phase locked loop is in the lock state when the frequency and/or phase relationship between the reference signal fref and the oscillation signal fvco is within a desired range. Otherwise, the phase locked loop is in the unlock state.

The channel selector 800 generates a modulation signal K and the N factor from a channel selection signal. The sigma-delta modulator 900 modulates the modulation signal K to generate the F factor. The controller 701 generates the current control signal CCS and the phase margin control signal CRS, based on the state signal (LS/ULS), the modulation signal K, and the N factor.

Figure 6:
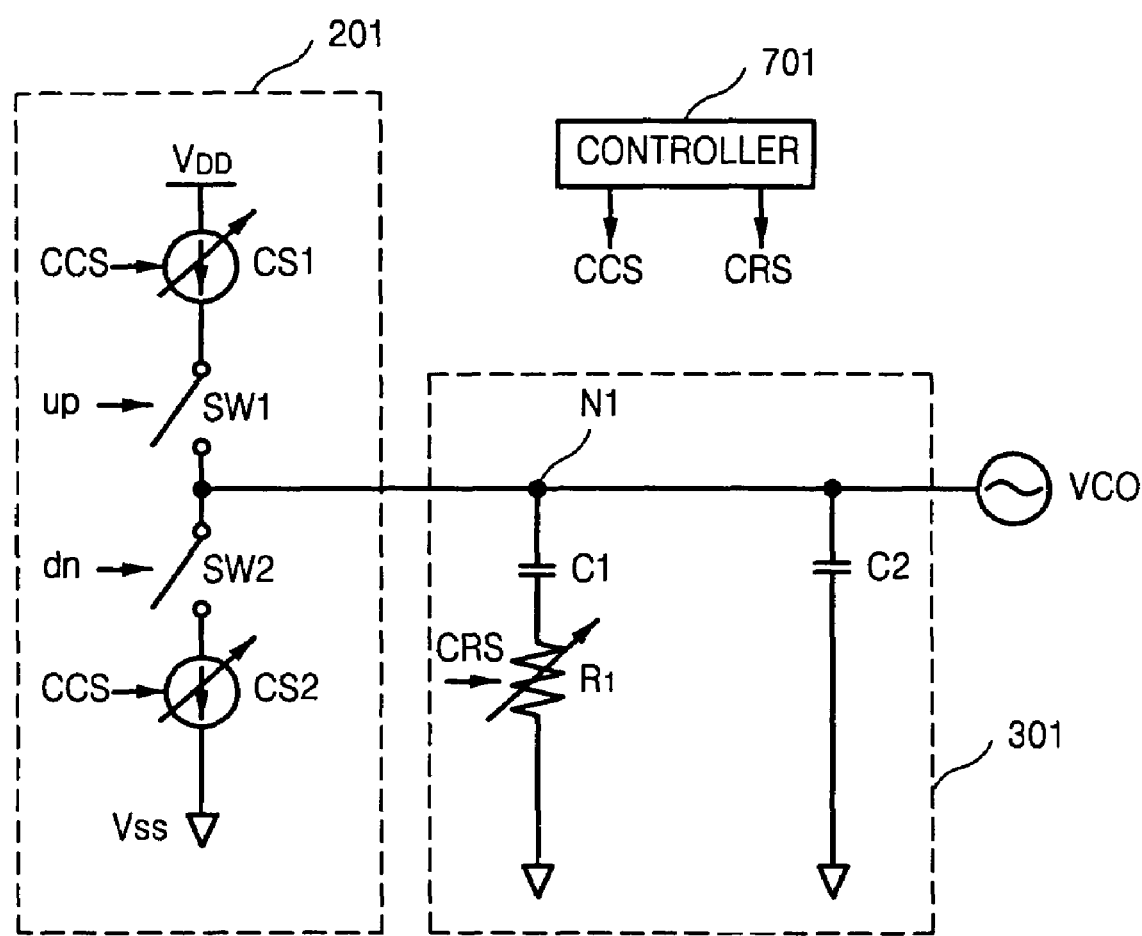
FIG. 6 shows an example of a charge pump and a loop filter in the phase locked loop of FIG. 5, according to an embodiment of the present invention.

FIG. 6 shows the charge pump 201 and the loop filter 301 of FIG. 5, according to an example embodiment of the present invention. The charge pump 201 includes a first current source CS1, a second current source CS2, a first switch SW1, and a second switch SW2.

The first current source CS1 is coupled between a high voltage supply VDD and a first node N1 via the first switch SW1 which is switched in response to the up-control signal up. The second current source CS2 is coupled between the first node N1 and a ground node via the second switch SW2 which is switched in response to the down-control signal dn. The first node N1 is an output terminal of the charge pump 201.

The first current source CS1 increases a charging current for charging the node N1 when the current control signal CCS indicates that the phase locked loop of FIG. 5 is in the unlock state and the up-control signal up is activated. The second current source CS2 increases a discharging current for discharging the node N1 when the current control signal CCS indicates that the phase locked loop of FIG. 5 is in the unlock state and the down-control signal dn is activated.

In either case, when the current control signal CCS indicates that the phase locked loop of FIG. 5 has reached the unlock state, the first current source CS1 increases the charging current (continuously or in incremental steps) when the up control signal has been activated, and the second current source CS2 reduces the discharging current (continuously or in incremental steps) when the dn control signal has been activated. In an alternative embodiment of the present-invention, the current control signal CCS may vary continuously or in incremental steps with time for directly controlling the charging current and/or the discharging current from the current sources CS1 and CS2 to vary continuously or in incremental steps with time.

The loop filter 301 includes a first capacitor C2, a second capacitor C1, and a variable resistor R1. The first capacitor C2 is coupled between the first node N1 and the ground node. The second capacitor C1 is coupled between the first node N1 and the ground node via the variable resistor R1.

When the phase margin control signal CRS indicates that the phase locked loop of FIG. 5 is in the unlock state, the resistance of the variable resistor R1 is reduced. Alternatively, when the phase margin control signal CRS indicates the lock state, the resistance of the variable resistor R1 is increased continuously or in incremental steps.

Figure 13:
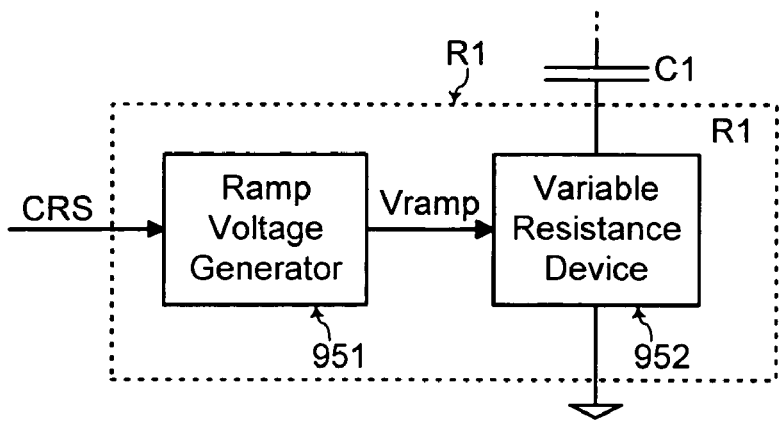
FIG. 13 shows an example loop filter with continuous change of resistance therein, according to an embodiment of the present invention.

FIG. 13 illustrates the variable resistor R1 providing a resistance that is changed continuously in one example embodiment of the present invention. A ramp voltage generator 951 generates a ramping voltage Vramp when the CRS control signal indicates the lock state. The increasing ramping voltage Vramp applied on a variable resistance device 952 causes a resistance that is continuously increased to be generated between the capacitor C1 and the ground node. Similarly, the resistance of the variable resistance device 952 is continuously decreased with a decreasing ramping voltage Vramp when the CRS control signal indicates the unlock state.

Figure 14:
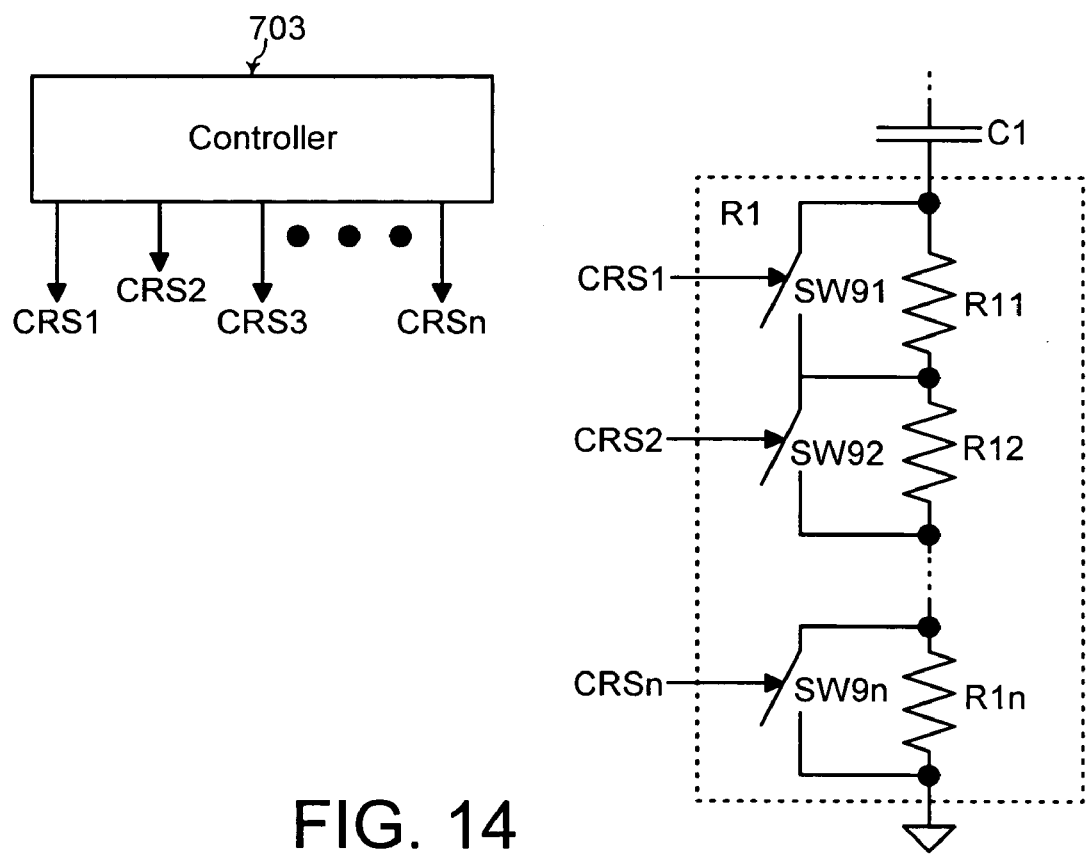
FIG. 14 shows an example loop filter with incremental change of resistance therein, according to an embodiment of the present invention.

Alternatively, FIG. 14 illustrates the variable resistor R1 providing a resistance that is changed in incremental steps in another example embodiment of the present invention. The controller 703 generates a plurality of control signals CRS1, CRS2, ..., and CRSn that is used to control a plurality of switches SW91, SW92, ... and SW9n. Each of the switches SW91, SW92, ... and SW9n is coupled across a respective one of a plurality of resistors R11, R12, ..., and R1n.

Each of the switches SW91, SW92, ... and SW9n is controlled by a respective one of the control signals CRS1, CRS2, ..., and CRSn. When the lock state detector 600 indicates that the phase locked loop is in the lock state, the controller adjusts the control signals CRS1, CRS2, ..., and CRSn with time such that the resistance from the capacitor C1 to the ground node is increased in incremental steps from R11, to (R11+R12), ..., and finally to (R11+R12+ ... +R1n) with time.

In an alternative embodiment of the present invention, the phase margin control signal CRS may vary continuously or in incremental steps with time for directly controlling the resistance of the variable resistor R1 to vary continuously or in incremental steps with time.

In any case, note that the current of the charge pump 201 is gradually decreased in the lock state from a high current through at least one intermediate current to a low current. In addition, the resistance of the variable resistor R1 is gradually increased in the lock state from a low resistance through at least one intermediate resistance to a high resistance. Such gradual changes within the charge pump 201 and the loop filter 301 reduce the frequency error of the phase locked loop of FIG. 5 as the loop bandwidth is decreased from a wide bandwidth to a narrow bandwidth.

Figure 7:
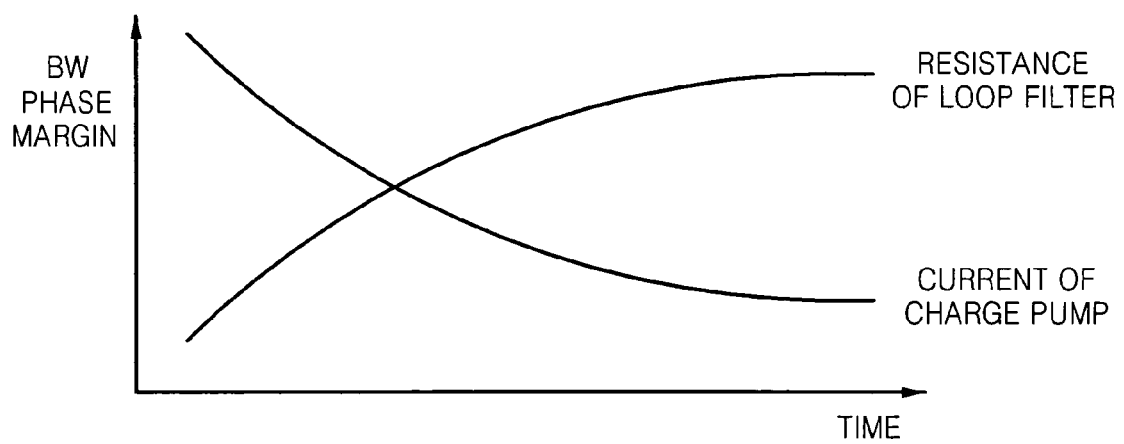
FIG. 7 shows change in charge pump current and loop filter resistance in the lock state of the sigma-delta fractional-N phase locked loop of FIG. 6, according to an embodiment of the present invention.
Figure 8:
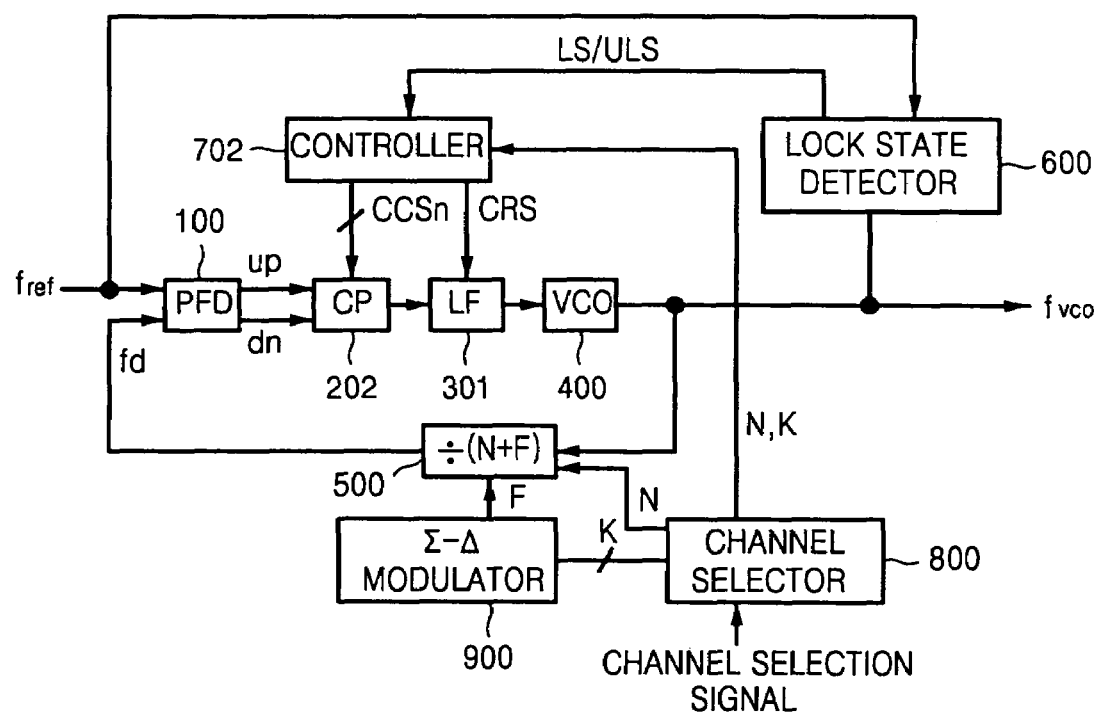
FIG. 8 shows a block diagram of a sigma-delta fractional-N phase locked loop, according to another embodiment of the present invention.

FIG. 7 illustrates continuous change of the current in the charge pump 201 and of the resistance within the loop filter 301, in response to the controls signals CCS and CRS in FIGS. 5 and 6, in one example embodiment of the present invention. FIG. 8 is a block diagram of a sigma-delta fractional-N phase locked loop with change to the current in the charge pump 201 in incremental steps, according to another embodiment of the present invention.

Such a phase locked loop includes a phase comparator 100, a charge pump 202, a loop filter 301, a voltage controlled oscillator (VCO) 400, a frequency divider circuit 500, a lock state detector 600, a sigma-delta modulator 900, a channel selector 800, and a controller 702. Elements having the same reference number in FIGS. 5 and 8 refer to elements having similar structure and/or function.

However, the controller 702 in FIG. 8 generates a plurality of switching control signals CCS1, CCS2, ..., and CCSn and a phase margin control signal CRS, based on the state signal (US/ULS), the modulation signal K, and the N factor. The charge pump 202 increases or decreases the current therein in incremental steps in response to the up and dn control signals and the plurality of switching control signals CCS1, CCS2, ..., and CCSn. The charge pump 202 increases the charge pump current in incremental steps to increase the loop bandwidth for faster lock in the unlock state, and reduces the charge pump current in incremental steps to decrease the loop bandwidth in the lock state.

Figure 9:
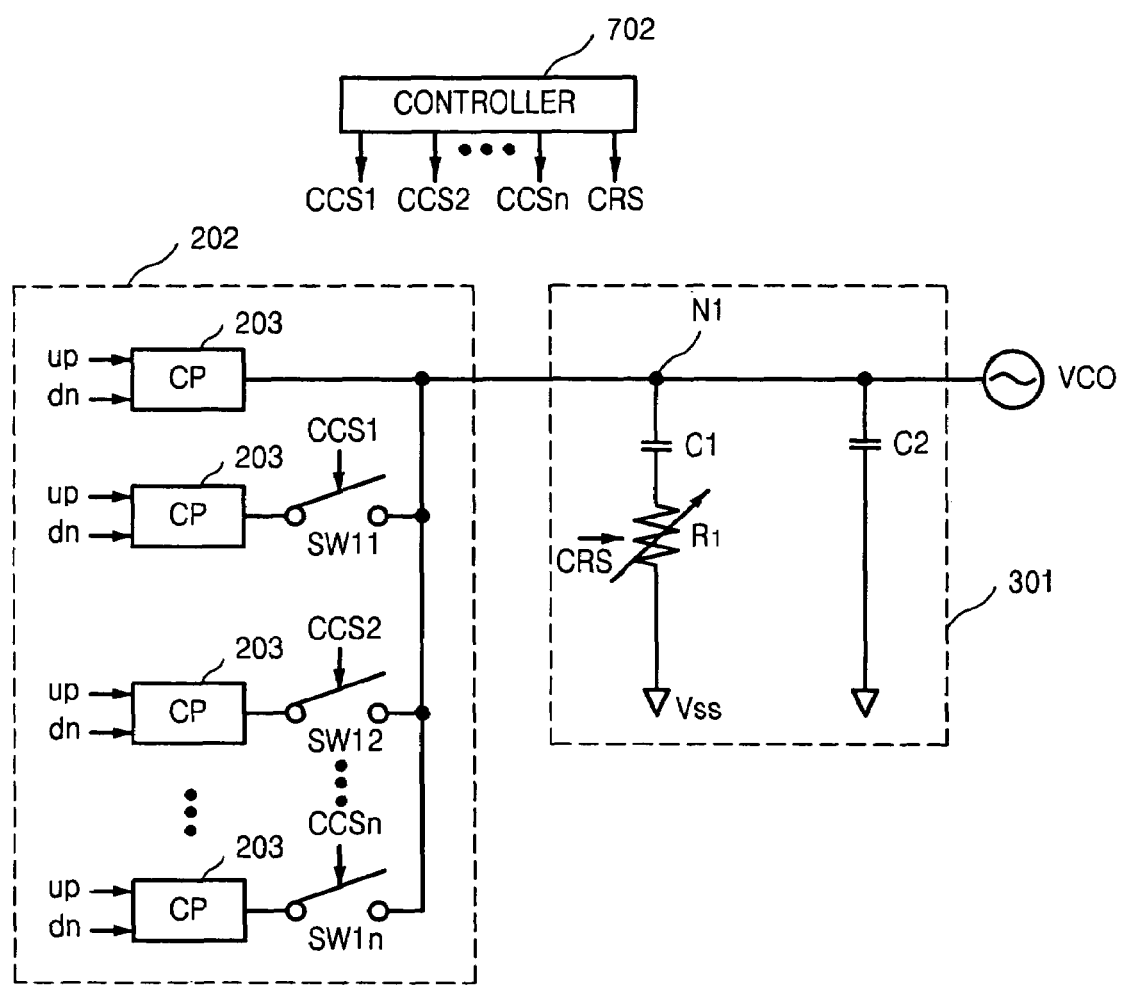
FIG. 9 shows an example of a charge pump and a loop filter in the phase locked loop of FIG. 8, according to an embodiment of the present invention.

FIG. 9 shows an example of the charge pump 202 and the loop filter 301 of FIG. 8, according to an embodiment of the present invention. Referring to FIG. 9, the charge pump 202 comprises a plurality of unit charge pumps 203 and a plurality of switches SW11, SW12, ..., and SW1n.

One of the charge pumps 203 is coupled to the output node N1. The rest of the charge pumps 203 are coupled to the output node N1, each via a respective one of the switches SW11, SW12, ..., and SW1n. Each of the switches SW11, SW12, ..., and SW1n is controlled by a respective one of the control signals CCS1, CCS2, ..., and CCSn.

Figure 10:
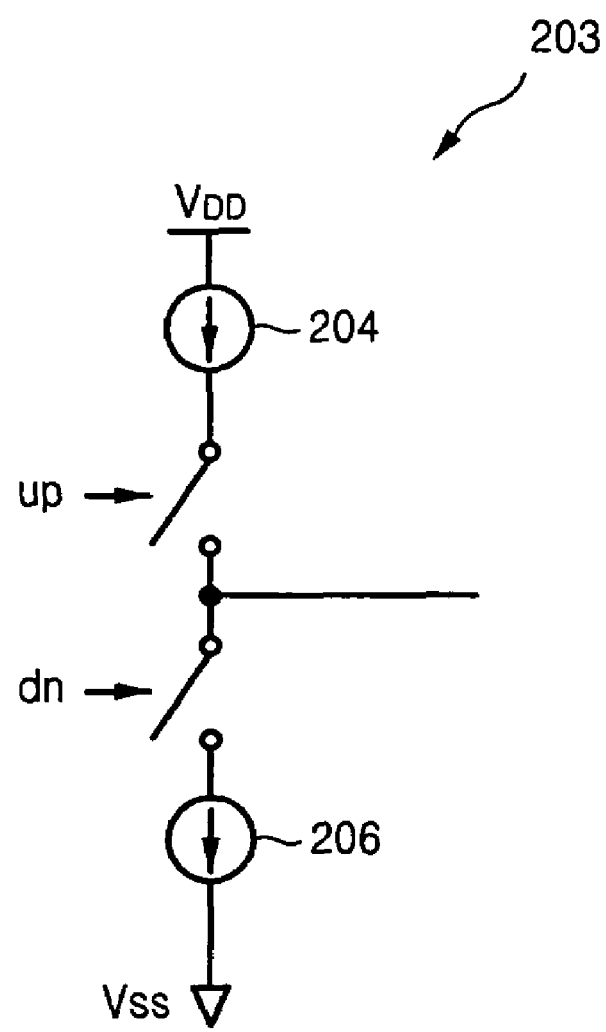
FIG. 10 shows a unit charge pump for each of the charge pumps of FIG. 9, according to an embodiment of the present invention.

In the unlock state, the current of the charge pump 202 is increased with all of the switches SW11, SW12, ..., and SW1n being closed. The charge pumps 203 each generates a charging or discharging current at the output node N1 depending on the up and dn control signals, as illustrated by an example unit charge pump 203 in FIG. 10.

Each unit charge pump 203 includes a first current source 204 that provides charging current when the switch controlled by the up control signal is closed. Each unit charge pump 203 also includes a second current source 206 that provides discharging current when the switch controlled by the dn control signal is closed.

In the lock state, the current of the charge pump 202 is decreased in incremental steps with the switches SW11, SW12, ..., and SW1n being opened one by one with time in response to the control signals CCS1, CCS2, ..., and CCSn. The loop filter 301 in FIG. 9 is similar to the loop filter 301 of FIG. 6.

Figure 11:
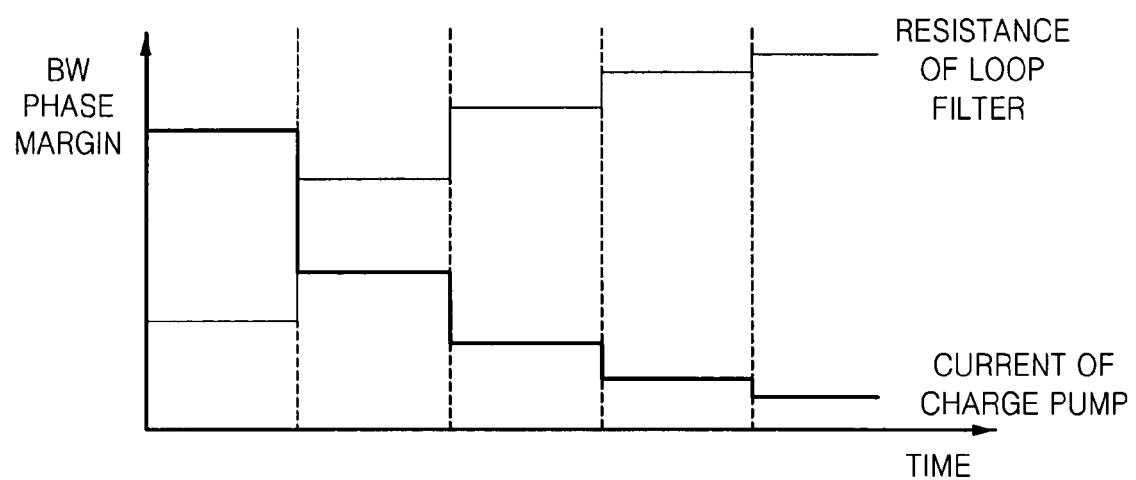
FIG. 11 shows change in charge pump current and loop filter resistance in the lock state of the sigma-delta fractional-N phase locked loop of FIG. 8, according to an embodiment of the present invention.

FIG. 11 illustrates the change in incremental steps for the charge pump current and the loop filter resistance within the lock state in the sigma-delta fractional-N phase locked loop of FIG. 8. The charge pump current decreases in incremental steps as the switches SW11, SW12, ..., and SW1n are opened one by one with time in response to the control signals CCS1, CCS2, ..., and CCSn. In addition, the loop filter resistance increases in incremental steps in response to the phase margin control signal CRS.

Figure 12A:
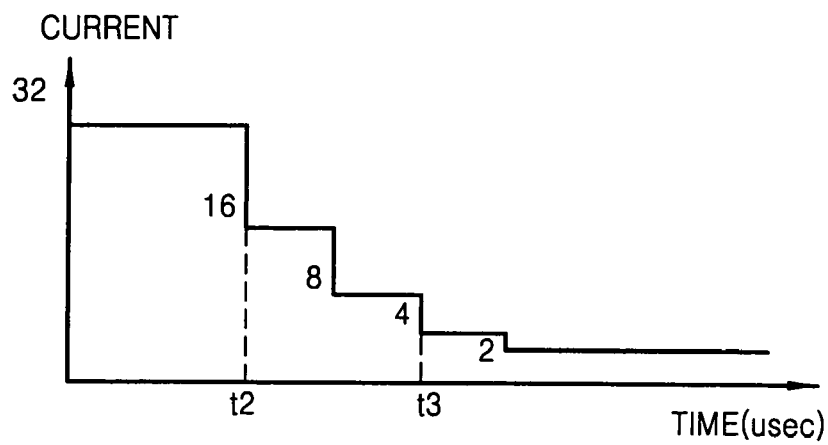
FIG. 12A illustrates incremental reduction of charge pump current for incremental reduction of loop bandwidth of the sigma-delta fractional-N phase locked loop of FIG. 8, according to an embodiment of the present invention.

FIG. 12A illustrates reducing the charge pump current in incremental steps to reduce the loop bandwidth of the sigma-delta fractional-N phase locked loop from a wide bandwidth to a narrow bandwidth. In the example of FIG. 12A, the loop bandwidth is reduced in incremental steps with decrease of the charge pump current from 32 mA to a half every 10 u secs from time t2 (797 μ sec) and with increase of the loop filter resistance from time t3 (820 μ sec).

Figure 12B:
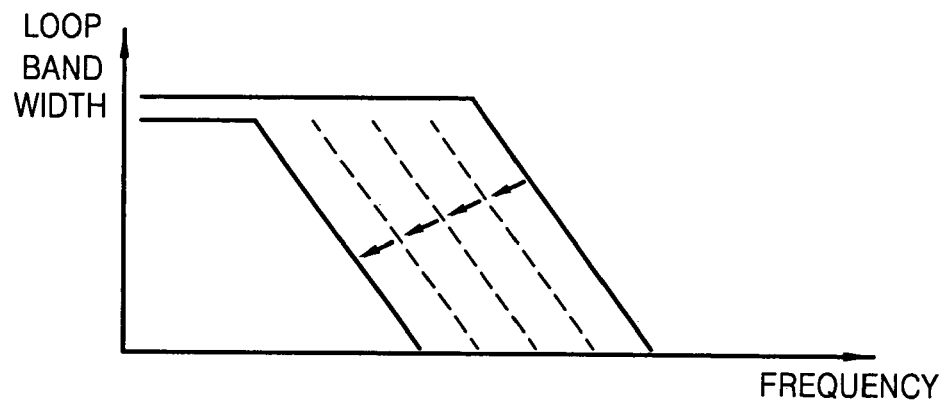
FIG. 12B illustrates incremental change of the loop bandwidth for the sigma-delta fractional-N phase locked loop of FIG. 8, according to an embodiment of the present invention.
Figure 12C:
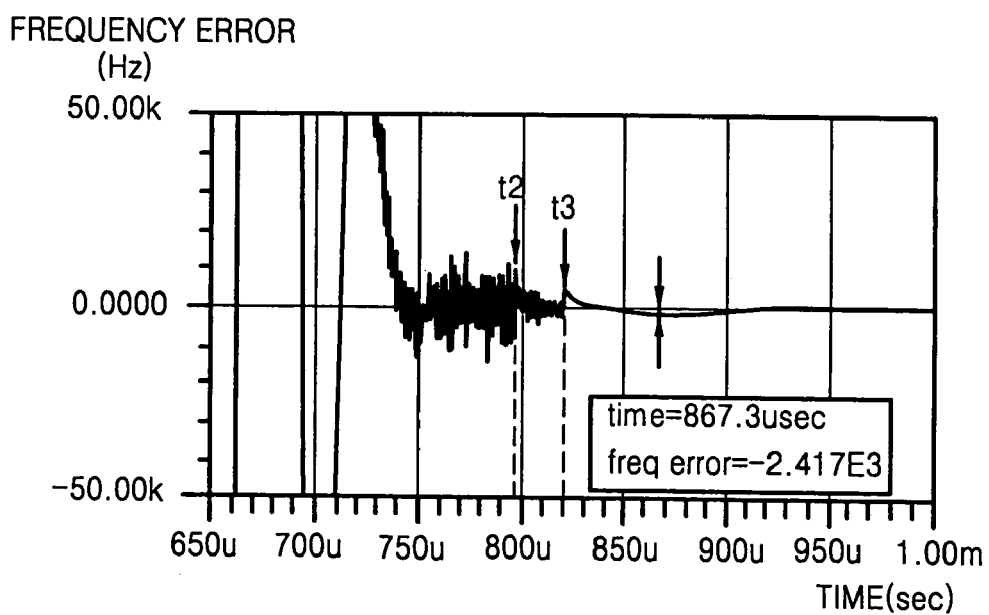
FIG. 12C shows frequency error of an output signal when the loop bandwidth of the sigma-delta fractional-N phase locked loop is changed incrementally from a wide bandwidth to a narrow bandwidth, according to an embodiment of the present invention.

FIG. 12B illustrates the change in incremental steps for the loop bandwidth of the sigma-delta fractional-N phase locked loop from a wide bandwidth to a narrow bandwidth. FIG. 12C shows frequency error of the output signal when the loop bandwidth of the sigma-delta fractional-N phase locked loop is changed according to FIG. 12B. Referring to FIG. 12C, the frequency error is maintained even after the loop bandwidth is reduced with the maximum frequency error of −2.417 Khz occurring at time 867.3 μ sec, showing that little frequency error exists.

Figure 1:
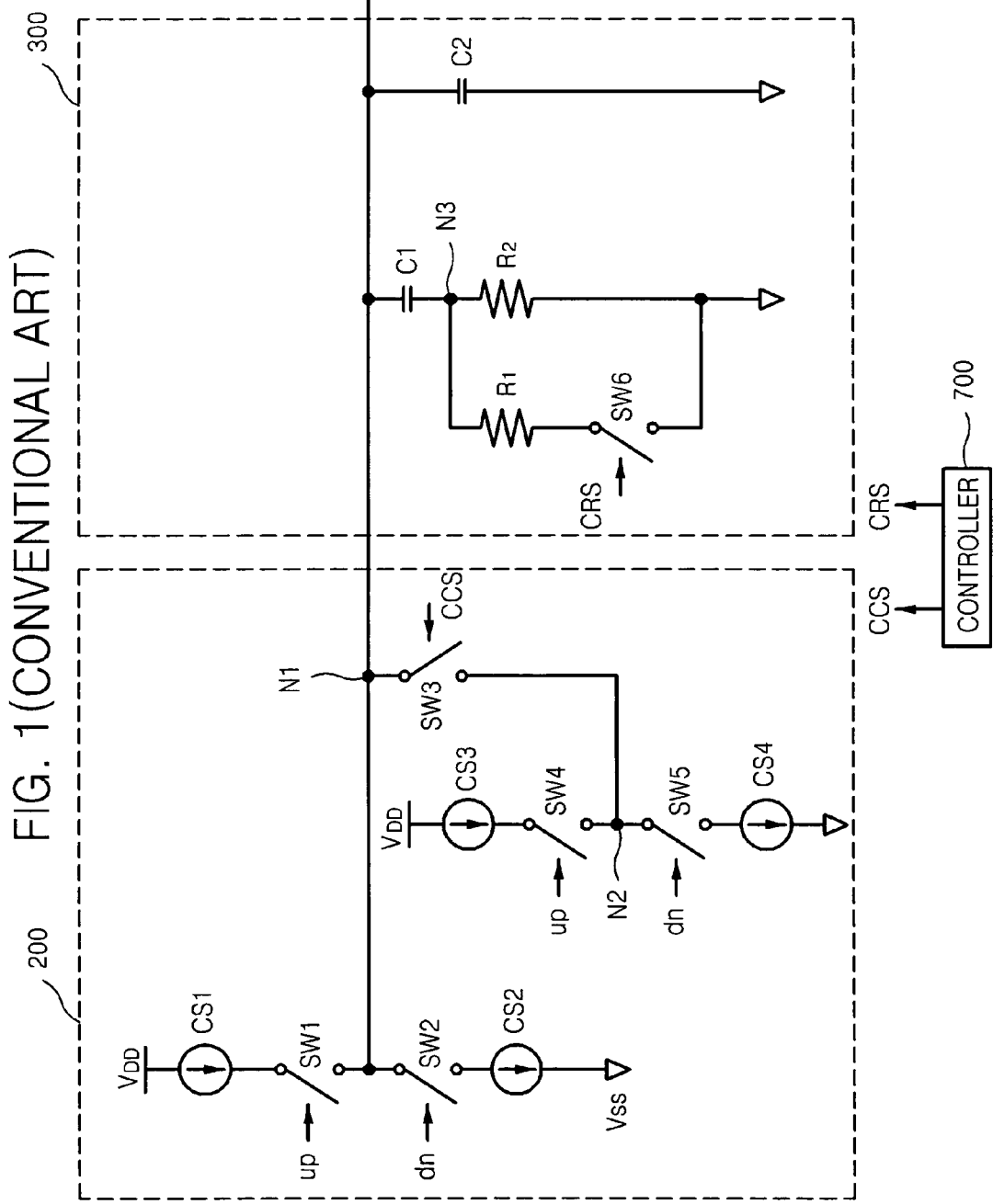
FIG. 1 shows a charge pump and a loop filter of a conventional phase locked loop with variable loop bandwidth.
Figure 2A:
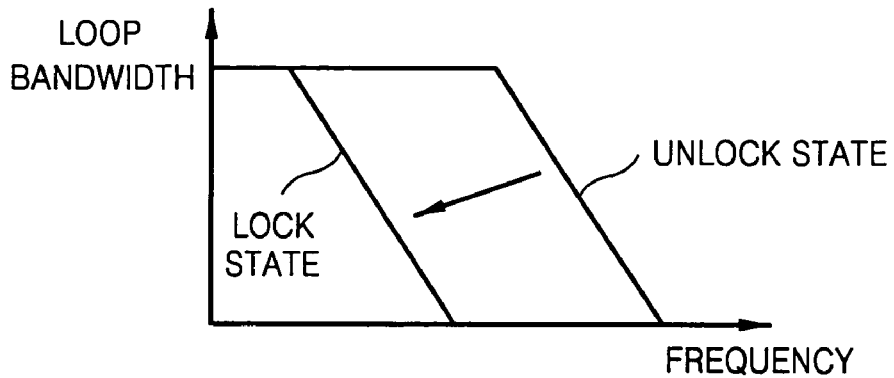
FIG. 2A illustrates change in loop bandwidth of the conventional sigma-delta fractional-N phase locked loop in the lock state and the unlock state.
Figure 2B:
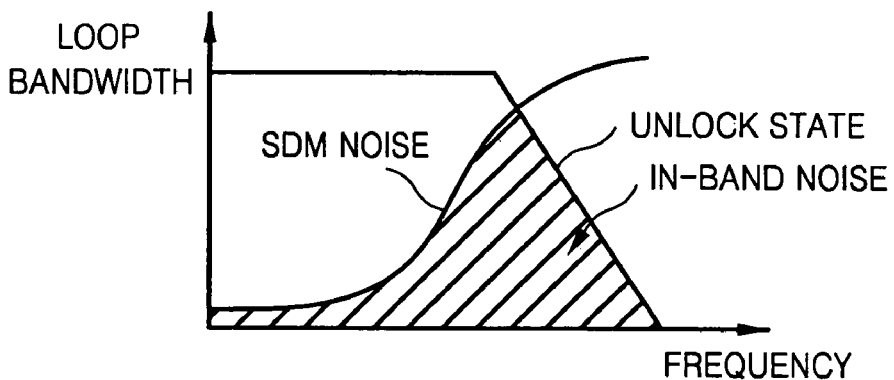
FIG. 2B illustrates in-band noise for higher loop bandwidth of the conventional sigma-delta fractional-N phase locked loop in the unlock state.
Figure 2C:
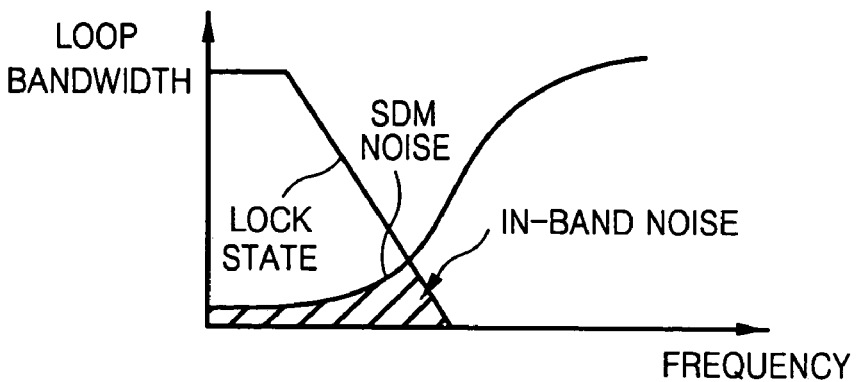
FIG. 2C illustrates reduced in-band noise for lower loop bandwidth of the conventional sigma-delta fractional-N phase locked loop in the lock state.
Figure 3A:
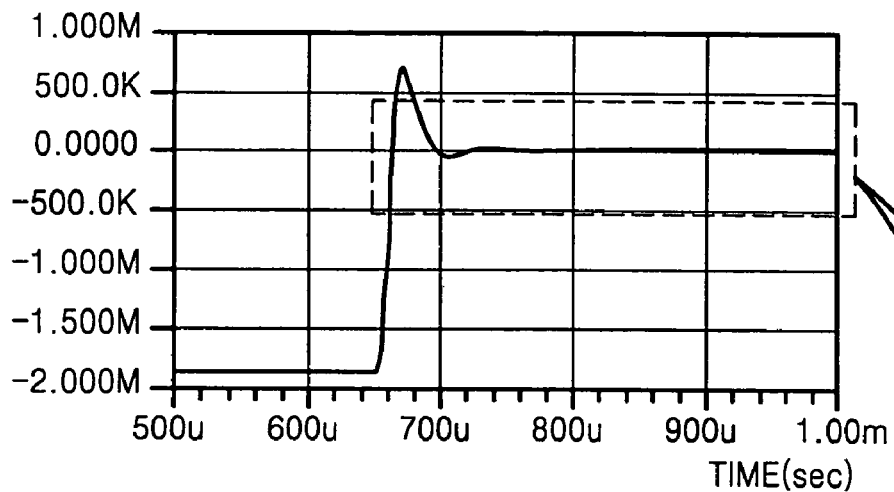
FIG. 3A shows a simulation of frequency error of an output signal when the loop bandwidth of the conventional sigma-delta fractional-N phase locked loop is varied.
Figure 3A:
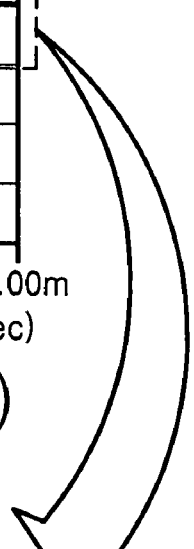
Figure 3B:
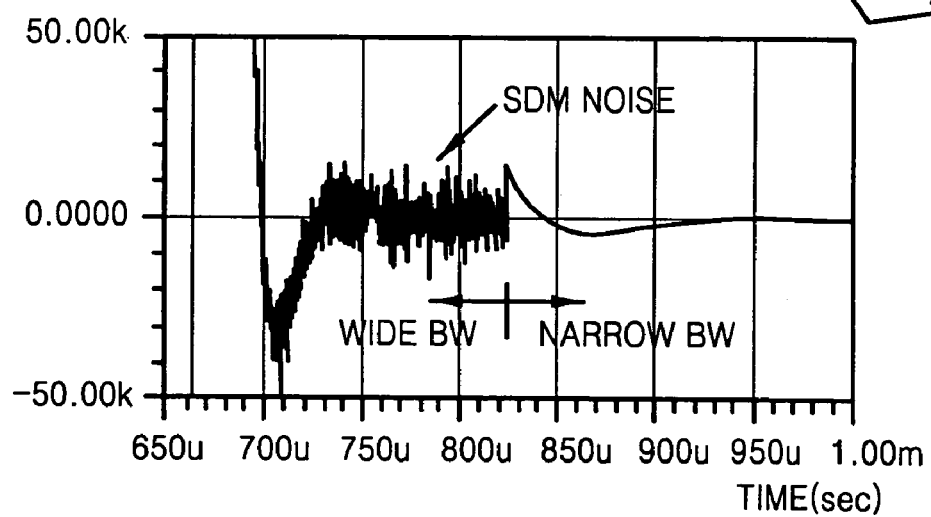
FIG. 3B shows an enlarged view of the frequency error of FIG. 3A.
Figure 4A:
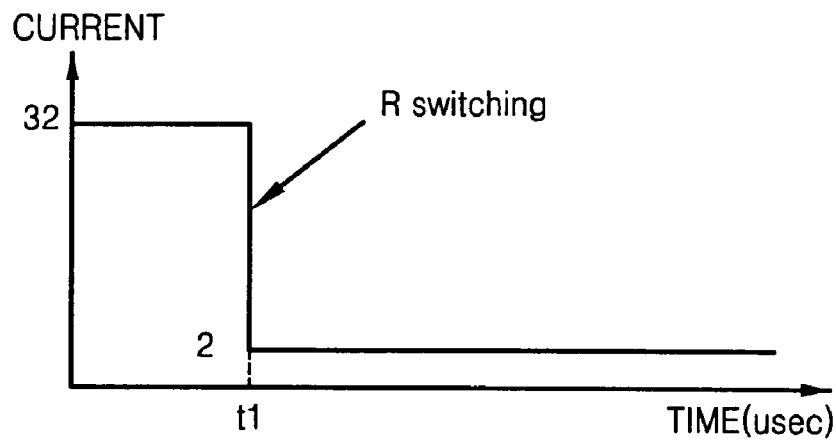
FIG. 4A illustrates a method for switching the loop bandwidth of the conventional sigma-delta fractional-N phase locked loop from a wide bandwidth to a narrow bandwidth.
Figure 4B:
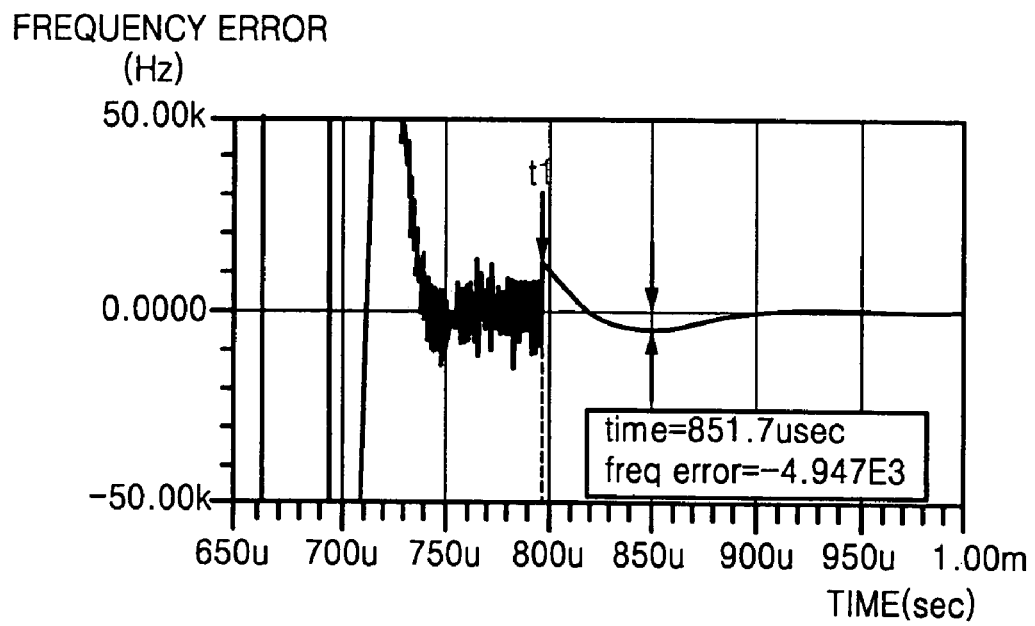
FIG. 4B illustrates frequency error of the output signal of the conventional sigma-delta fractional-N phase locked loop according to the change of the loop bandwidth as shown in FIG. 4A.

In contrast in FIG. 4B of the prior art, the maximum frequency error is −4.947 Khz after the loop bandwidth of the phase locked loop is reduced at once. Thus, the frequency error is significantly reduced with the present invention.

In this manner, because the resistance of the loop filter 301 is increased gradually, the frequency error of the sigma-delta fractional-N phase locked loop according to embodiments of the present invention is decreased in the lock state. Furthermore, when the current in the charge pump is also decreased gradually in the lock state, such a frequency error may be decreased even further.

Additionally, the sigma-delta fractional-N phase locked loop has faster lock time with increased charge pump current and decreased loop filter resistance in the unlock state. On the other hand, the sigma-delta fractional-N phase locked loop has lower noise susceptibility and lower frequency error with gradual decrease in charge pump current and gradual increase in loop filter resistance, in the lock state.

The foregoing is by way of example only and is not intended to be limiting. For example, any numbers or number of elements illustrated and described herein are by way of example only. The present invention is limited only as defined in the following claims and equivalents thereof.

What is claimed is:

1. A sigma-delta fractional-N phase locked loop, comprising:
    a controller for generating at least one control signal indicating a lock state or an unlock state of the phase locked loop; and
    a loop filter that successively increases a resistance therein through at least one intermediate resistance from a low resistance to a high resistance when the at least one control signal indicates the lock state.

2. The sigma-delta fractional-N phase locked loop of claim 1, wherein the loop filter includes:
    means for increasing the resistance continuously in the lock state.

3. The sigma-delta fractional-N phase locked loop of claim 1, wherein the loop filter includes:
    means for increasing the resistance incrementally in the lock state.

4. The sigma-delta fractional-N phase locked loop of claim 1, further comprising:
    a charge pump that successively decreases a current therein through at least one intermediate current from a high current to a low current in the lock state,
    wherein the charge pump generates an original control signal filtered by the loop filter for generating a filtered signal.

5. The sigma-delta fractional-N phase locked loop of claim 4, wherein the charge pump includes:
    means for decreasing the current continuously in the lock state.

6. The sigma-delta fractional-N phase locked loop of claim 4, wherein the charge pump includes:
    means for decreasing the current incrementally in the lock state.

7. The sigma-delta fractional-N phase locked loop of claim 4, further comprising:
    a voltage controlled oscillator that generates an oscillation signal from the filtered signal.

8. The sigma-delta fractional-N phase locked loop of claim 7, further comprising:
    a phase detector that generates up and down control signals for controlling the charge pump from comparing the oscillation signal with a reference signal.

9. The sigma-delta fractional-N phase locked loop of claim 8, further comprising:
    a frequency divider for performing frequency division on the oscillation signal to generate a divided oscillation signal,
    wherein the phase detector generates the up and down control signals from comparing at least one of phases and frequencies of the divided oscillation signal with the reference signal.

10. The sigma-delta fractional-N phase locked loop of claim 9, further comprising:
    a channel selector that generates a modulation signal and a first frequency division factor from a channel selection signal; and
    a sigma-delta modulator that generates a second frequency division factor from the modulation signal;
    wherein the frequency divider performs frequency division on the oscillation signal according to the first and second frequency division factors to generate the divided oscillation signal.

11. The sigma-delta fractional-N phase locked loop of claim 7, further comprising:
    a lock state detector for determining one of the lock state or the unlock state for the controller from the oscillation signal and the reference signal.

12. The sigma-delta fractional-N phase locked loop of claim 7, wherein the loop filter includes:
    a first capacitor coupled between an output of the charge pump and a ground node;
    a second capacitor coupled to the output of the charge pump; and
    a variable resistor coupled between the second capacitor and the ground node,
    wherein the variable resistor generates the resistance that successively increases in the lock state.

13. A method of operating in a lock state within a sigma-delta fractional-N phase locked loop, comprising:
    generating at least one control signal indicating the lock state or an unlock state of the phase locked loop; and
    successively increasing a resistance in a loop filter of the phase locked loop through at least one intermediate resistance from a low resistance to a high resistance when the at least one control signal indicates the lock state.

14. The method of claim 13, further comprising:
    increasing the resistance continuously or incrementally, in the lock state.

15. The method of claim 13, further comprising:
    successively decreasing a current in a charge pump through at least one intermediate current from a high current to a low current in the lock state,
    wherein the charge pump generates an original signal filtered by the loop filter for generating a filtered control signal.

16. The method of claim 15, further comprising:
    decreasing the current continuously or incrementally, in the lock state.

17. The method of claim 15, further comprising:
    generating an oscillation signal from the filtered signal.

18. The method of claim 17, further comprising:
    performing frequency division on the oscillation signal to generate a divided oscillation signal; and generating up and down control signals for controlling the charge pump from comparing the divided oscillation signal with a reference signal.

19. The method of claim 18, further comprising:

generating a modulation signal and a first frequency division factor from a channel selection signal;

generating a second frequency division factor from the modulation signal; and performing frequency division on the oscillation signal according to the first and second frequency division factors to generate the divided oscillation signal.

20. The method of claim 17, further comprising:

determining one of the lock state or the unlock state from the oscillation signal and the reference signal.

* * * * *